United States Patent
Woo et al.

(10) Patent No.: US 7,888,997 B2
(45) Date of Patent: *Feb. 15, 2011

(54) SYSTEMS, METHODS, AND APPARATUSES FOR LINEAR ENVELOPE ELIMINATION AND RESTORATION TRANSMITTERS

(75) Inventors: Wangmyong Woo, Cumming, GA (US);
Chang-Ho Lee, Marietta, GA (US);
Jaejoon Chang, Duluth, GA (US);
Haksun Kim, Daejeon (KR)

(73) Assignee: Samsung Electro-Mechanics (KR)

( * ) Notice: Subject to any disclaimer, the term of this patent is extended or adjusted under 35 U.S.C. 154(b) by 183 days.

This patent is subject to a terminal disclaimer.

(21) Appl. No.: 12/406,183

(22) Filed: Mar. 18, 2009

(65) Prior Publication Data

US 2009/0174473 A1     Jul. 9, 2009

Related U.S. Application Data (63) Continuation of application No. 11/754,119, filed on May 25, 2007, now Pat. No. 7,518,445.

(60) Provisional application No. 60/803,871, filed on Jun. 4, 2006.

(51) Int. Cl.
*H03F 3/38* (2006.01)
(52) U.S. Cl. .................................. 330/10; 330/149
(58) Field of Classification Search ............... 330/10, 330/149, 129, 136; 375/238, 297; 455/114.3
See application file for complete search history.

(56) References Cited

U.S. PATENT DOCUMENTS

| | | | |
|---|---|---|---|
| 5,140,703 A * | 8/1992 | Payne | ....................... 455/226.1 |
| 5,420,536 A | 5/1995 | Faulkner et al. | |
| 5,742,201 A | 4/1998 | Eisenberg et al. | |
| 6,141,390 A | 10/2000 | Cova | |
| 6,236,267 B1 * | 5/2001 | Anzil | ........................ 330/149 |

(Continued)

FOREIGN PATENT DOCUMENTS

DE     10257436     9/2003

(Continued)

OTHER PUBLICATIONS

Office Action dated Apr. 1, 2008 for Korean Application No. 10-2007-005710.

(Continued)

*Primary Examiner*—Henry K Choe
(74) *Attorney, Agent, or Firm*—Sutherland Asbill & Brennan LLP (57) ABSTRACT

Systems, methods, and apparatuses are provided for linear envelope elimination and restoration transmitters that are based on the polar modulation operating in conjunction with the orthogonal recursive predistortion technique. The polar modulation technique enhances the battery life by dynamically adjusting the bias level. Further, the analog orthogonal recursive predistortion efficiently corrects amplitude and phase errors in radio frequency (RF) power amplifiers (PA) and enhances the PA output capability. Additionally, even-order distortion components are used to predistort the input signal in a multiplicative manner so that the effective correction bandwidth is greatly enhanced. Also, the predistortion scheme, which uses instantaneously feed-backed envelope distortion signals, allows for correction of any distortion that may occur within the correction loop bandwidth, including envelope memory effects.

20 Claims, 11 Drawing Sheets

U.S. PATENT DOCUMENTS

| | | |
|---|---|---|
| 6,295,442 B1 | 9/2001 | Camp, Jr. et al. |
| 6,396,345 B2 | 5/2002 | Dolman |
| 6,449,465 B1 * | 9/2002 | Gailus et al. ............... 455/126 |
| 6,642,786 B1 | 11/2003 | Jin et al. |
| 6,794,938 B2 | 9/2004 | Weldon |
| 6,831,905 B1 | 12/2004 | Lomp et al. |
| 6,914,483 B2 | 7/2005 | Shigaki |
| 6,985,467 B2 | 1/2006 | Lomp et al. |
| 7,024,620 B2 | 4/2006 | Ponce et al. |
| 7,042,286 B2 | 5/2006 | Meade et al. |
| 7,379,715 B2 | 5/2008 | Udagawa et al. |
| 7,460,613 B2 | 12/2008 | Sahlman |
| 7,532,676 B2 | 5/2009 | Fonseka et al. |
| 2002/0196864 A1 | 12/2002 | Booth et al. |
| 2005/0239422 A1 | 10/2005 | Jafari et al. |
| 2006/0071711 A1 | 4/2006 | Persson et al. |
| 2006/0178120 A1 | 8/2006 | Puma |

FOREIGN PATENT DOCUMENTS

| | | |
|---|---|---|
| DE | 10257436 A1 | 9/2003 |
| DE | 10257435 | 9/2004 |
| DE | 10257435 B3 | 9/2004 |
| EP | 1017162 A2 | 7/2000 |
| EP | 1691518 A2 | 1/2006 |
| EP | 1691518 A2 | 8/2006 |
| GB | 2380880 A | 4/2003 |
| KR | 1020040016366 A | 2/2004 |
| WO | 0233844 A | 4/2002 |
| WO | WO 0233844 A | 4/2002 |
| WO | 0247249 A | 6/2002 |
| WO | WO 0247249 A | 6/2002 |
| WO | WO 2005015756 A1 | 2/2005 |

OTHER PUBLICATIONS

United Kingdom Search Report for GB0710605.7 dated Sep. 27, 2007.

United Kingdom Search Report for GB0710609.9 dated Sep. 27, 2007.

Non-final Office Action for U.S. Appl. No. 11/754,112 mailed Nov. 12, 2009.

Notice of Allowance for U.S. Appl. No. 11/754,119 mailed Sep. 16, 2008.

Notice of Allowance for U.S. Appl. No. 11/754,119 mailed Jan. 9, 2009.

Notice of Allowance for U.S. Appl. No. 11/754,122 mailed Nov. 13, 2009.

German Office Action issued on Aug. 23, 2008 for German Patent Application No. 102007026022.

United Kingdom Search Report for GB0710602.4 dated Sep. 27, 2007.

Woo, W., A Predistortion Linearization System for High Power Amplifiers with Low Frequency Envelope Memory Effects, Microwave Symposium Digest, 2005, IEEE MTT-S International, Jun. 12-17, 2005, 4 pages.

Woo, W. "A Predistortion Linearization System for High Power Amplifiers with Low Frequency Envelop Memory Effects." Microwave Symposium Digest, 2005, IEEE MTT-S International, Jun. 12-17, 2005, 4 pages.

German Office Action for German Patent Application No. 102007026022 issued on Aug. 23, 2008.

United Kingdom Search Report for GB 0710602.4, dated Sep. 27, 2007.

Office Action for Chinese Application No. 200710110606 dated Jun. 5, 2010.

Notice of Allowance fir U.S. Appl. No. 11/754,112 mailed Sep. 2, 2010.

Non-Final Office Action for U.S. Appl. No. 11/754,122 mailed Jul. 16, 2010.

Notice of Allowance for U.S. Appl. No. 11/754,122 mailed Oct. 13, 2010.

* cited by examiner

SYSTEMS, METHODS, AND APPARATUSES FOR LINEAR ENVELOPE ELIMINATION AND RESTORATION TRANSMITTERS

RELATED APPLICATIONS

This application is a continuation of U.S. Non-Provisional application Ser. No. 11/754,119, filed on May 25, 2007, and entitled "Systems, Methods, and Apparatuses for Linear Envelope Elimination and Restoration Transmitters, which claims priority to U.S. Provisional Ser. No. 60/803,871, filed on Jun. 4, 2006, and entitled "Systems, Methods, and Apparatuses for Linear Polar Transmitters." All of the foregoing applications are incorporated by reference in their entirety as if fully set forth herein.

FIELD OF THE INVENTION

The invention relates generally to linear envelope elimination and restoration (EER) transmitters, and more particularly to systems, methods, and apparatuses for the performance enhancement of radio frequency (RF) power amplifiers.

BACKGROUND OF THE INVENTION

In cost-sensitive mobile transmitters, performance trade-offs must be carefully managed to achieve high efficiency and high output power at the required gain and linearity. With an intrinsically nonlinear power amplifier (PA) itself, the only way to achieve a better linear operation is to restrict the dynamic range of signals to a small fraction of the PA's overall capability. Unfortunately, such a restriction in the dynamic range to achieve a more linear operation is quite inefficient since it requires the construction of an amplifier that is much larger in size and consumes more power.

With the demand to increase data transmission rates and communication capacity, Enhanced Data rate for GSM Evolution (EDGE) has been introduced within the existing GSM (Global System for Mobile communications) specifications and infrastructure. GSM is based on a constant envelope modulation scheme of Gaussian Minimum Shift Keying (GMSK), while EDGE is based on an envelope-varying modulation scheme of $3\pi/8$-shifted 8-phase shift keying (8-PSK) principally to improve spectral efficiency. Because of this envelope-varying modulation scheme, EDGE transmitters are more sensitive to PA nonlinearities, which can significantly and negatively affect the performance of an EDGE handset. Also, Wideband Code Division Multiple Access (WCDMA) is another communication technology that has much higher data rate (~2 Mbps) than the data rate (384 kbps) of EDGE. It is the leading global wireless broadband standards to deliver 3G multimedia applications like videoconferencing, imaging and video, 3D games and high-end stereo to mobile users. The combination of GSM/EDGE and WCDMA technology on a single, cost-effective system architecture provides mobile users with a more seamless experience as they roam within networks enabled by both technologies while taking advantage of the highest network connection speed available. Mobile device design complexity is also minimized by combining the leading mobile wireless and multimedia technologies onto a single system. However, as for EDGE, WCDMA is based on an envelope-varying modulation scheme of Hybrid Phase Shift Keying (HPSK). As a result, WEGDE (WCDMA and EDGE) transmitters require efficient, accurate amplitude and phase control with additional blocks to compensate for distortion caused by the PA nonlinear characteristics and non-constant envelope variation.

To provide for efficiently amplified signal transmissions, many EER transmitter architectures have been proposed in the form of either an open-loop with digital predistortion scheme or a closed-loop with analog feedback scheme.

First, in the conventional open-loop with digital predistortion scheme, the PA is characterized by calibration data including powers, temperatures, and frequencies. The calibration data is then stored in look-up tables (LUTs). The correct coefficients for the operating conditions, which come from the LUT, are selected by digital logic and applied for predistortion. The DSP-based linearization can provide an accurate, stable operation as well as easy modification by the power of software programming. However, this technique requires time-consuming calibration on the production line to compensate for part-to-part variations and cannot easily correct any aging effects in the system. When including a feedback path to look at the PA output changes, the circuitry becomes costly and consumes a considerable amount of DC power.

Second, a closed-loop envelope feedback control is generally used for analog linearization. In such a feedback control structure, a precise receiver has to be included within the transmitter and the control-loop bandwidth should greatly exceed the signal bandwidth. In addition, the intrinsic gain reduction characteristic in the negative feedback may cause a severe restriction to amplifiers that do not have enough transmission gain. Additionally, conventional closed-loop systems feed back both distortion and signal power, thereby reducing the stability of the closed-loop systems. Likewise, power amplifiers used in these conventional polar modulation systems are operated at highly nonlinear switching modes for efficiency so the cancellation of high-order distortion components becomes more important.

BRIEF SUMMARY OF THE INVENTION

Embodiments of the invention may provide for an analog linear EER transmitter architecture using the orthogonal recursive predistortion technique. This transmitter architecture may operate in a low power mode and achieve greater bandwidth by feeding the low-frequency even-order distortion components (i.e., the deviation from linear gain) back. Moreover, the distortion components may not be added to the input signal as feedback, but rather may be used to predistort the input signal in a multiplicative manner. In particular, the low-frequency even-order distortion components may generate odd-order in-band distortion terms when they are multiplied by the fundamental signal. Thus, such architecture may be inherently more stable than conventional additive polar loop systems.

According to an embodiment of the invention, there is a method for providing a linear envelope elimination and restoration transmitter. The method may include generating an input amplitude signal and an input phase signal, where the input amplitude signal and the input phase signal are orthogonal components of an input signal, and where the input amplitude signal and the input phase signal are generated on respective first and second signal paths. The method may also include processing the input amplitude signal along the first signal path using an amplitude error signal to generate a predistorted amplitude signal, processing the input phase signal along the second signal path using an phase error signal to generate a predistorted phase signal, and providing the predistorted amplitude signal along the first signal path and the predistorted phase signal along the second signal path to a power amplifier to generate an output signal. The method may further include applying a first logarithmic amplifier to the output signal of the power amplifier to obtain a log-detected output signal, and applying a second logarithmic amplifier to the predistorted amplitude signal to obtain a log-detected predistorted amplitude signal. The method may also include applying a first amplitude limiter to the output signal of the power amplifier to obtain an amplitude-limited output signal, and applying a second amplitude limiter to the predistorted phase signal to obtain an amplitude-limited predistorted phase signal, where the amplitude error signal is generated from a comparison of at least a log-detected output signal with the log-detected predistorted amplitude signal, and where the phase error signal is generated from a comparison of at least the amplitude-limited output signal with the amplitude-limited predistorted phase signal.

According to an embodiment of the invention, there is a system for a linear envelope elimination and restoration transmitter. The system may include an input amplitude signal and an input phase signal, where the input amplitude signal and the input phase signal are orthogonal components of an input signal, and where the input amplitude signal and the input phase signal are provided on respective first and second signal paths. The system may also include a first predistortion module that processes the input amplitude signal along the first signal path using an inverse amplitude error signal to generate a predistorted amplitude signal, a second predistortion module that processes the input phase signal along the second signal path using an inverse phase error signal to generate a predistorted phase signal, and a power amplifier that receives the predistorted amplitude signal along the first signal path and the predistorted phase signal along the second signal path and generates an output signal based upon the predistorted amplitude signal and the predistorted phase signal. The system may further include at least one logarithmic amplifier that retrieves a log-detected output signal from the output signal of the power amplifier and that retrieves a log-detected predistorted amplitude signal from the predistorted amplitude signal, and at least one amplitude limiter that retrieves a limited output signal from the output signal of the power amplifier and that retrieves a limited predistorted phase signal from the predistorted phase signal, where the amplitude error signal is generated from a comparison of at least the log-detected output signal with the log-detected predistorted amplitude signal, and wherein the phase error signal is generated from a comparison of at least the amplitude-limited output signal with the amplitude-limited predistorted phase signal.

According to yet another embodiment of the invention, there is a system for providing a linear polar transmitter. The system may include an input amplitude signal and an input phase signal, where the input amplitude signal and the input phase signal are orthogonal components of an input signal, and where the input amplitude signal and the input phase signal are provided on respective first and second signal paths. The system may also include first means for processing the input amplitude signal along the first signal path using an inverse amplitude error signal to generate a predistorted amplitude signal, second means for processing the input phase signal along the second signal path using an inverse phase error signal to generate a predistorted phase signal, and a power amplifier that receives the predistorted amplitude signal along the first signal path and the predistorted phase signal along the second signal path and generates an output signal based upon the predistorted amplitude signal and the predistorted phase signal. The system may further include third means for generating the inverse amplitude error signal from the output signal and the predistorted amplitude signal, and fourth means for generating the inverse phase error signal from the output signal and the predistorted phase signal.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

The invention will now be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for linear EER transmitters that are based upon a polar modulation technique using two orthogonal paths for amplitude and phase, and an analog orthogonal recursive predistortion linearization technique. The polar modulation technique may enhance the battery life by dynamically adjusting the bias level. Additionally, the analog orthogonal recursive predistortion may provide for a substantially instantaneous correction of amplitude and phase errors in an RF PA, thereby enhancing the linear output power capability and efficiency of the PA. Additionally, embodiments of the invention may utilize even-order distortion components to predistort the input signal in a multiplicative manner, which allows for correction of any distortion that may occur within the correction loop bandwidth, including envelope memory effects.

Figure 1A:
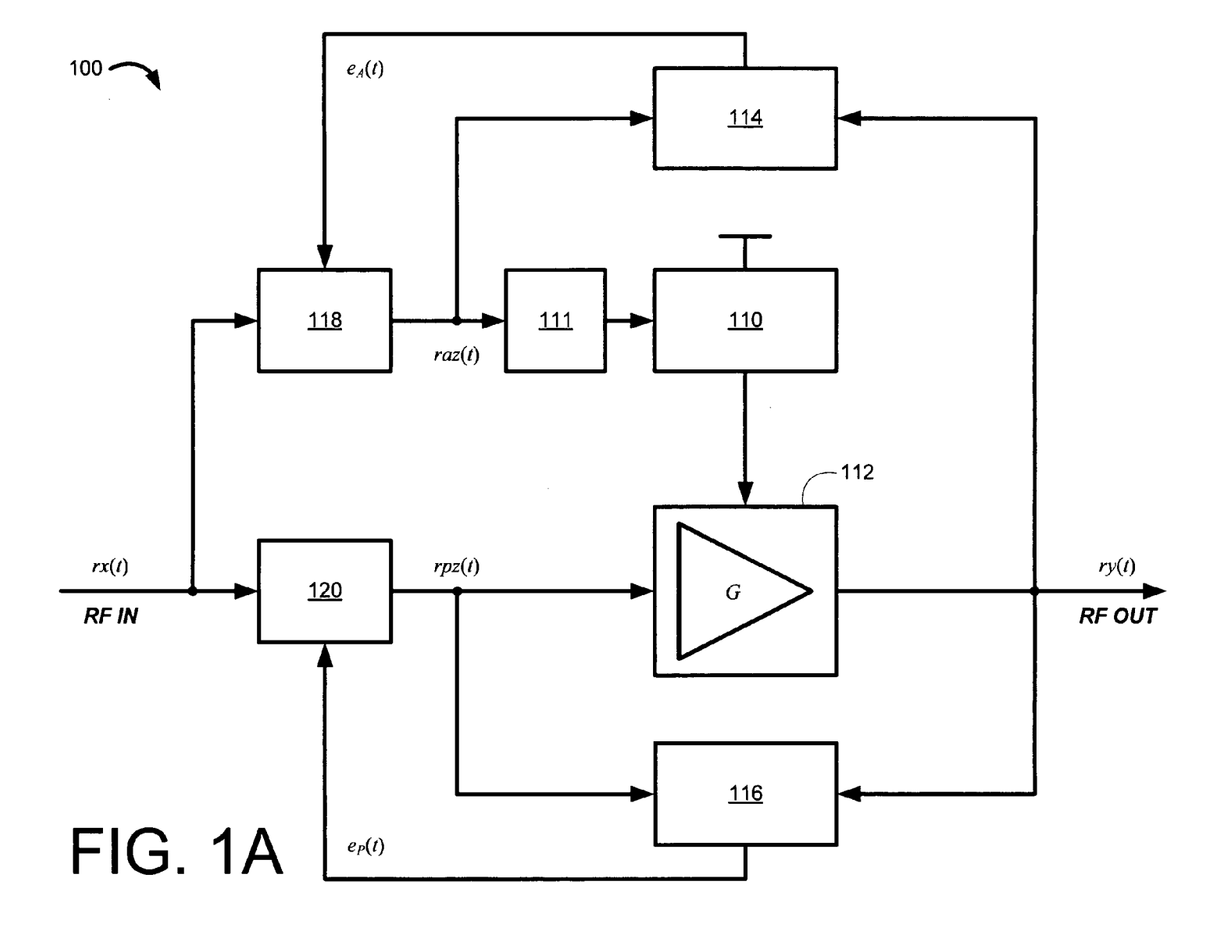
FIGS. 1A and 1B illustrate functional block diagrams of an illustrative EER transmitter system in accordance with an embodiment of the invention.

FIG. 1A illustrates a simplified functional block diagram of an illustrative EER transmitter system 100 in accordance with an embodiment of the invention. As shown in FIG. 1A, the EER transmitter system 100 may include an amplitude predistortion module 118, a phase predistortion module 120, an amplifier power control (APC) module 110, a diode-based envelope detector 111 at the input of the APC module 110, a power amplifier module 112, an amplitude modulation error detection module 114, and a phase modulation error detection module 116. During operation of the EER transmitter system 100, a complex RF signal may be modulated with two orthogonal baseband input signals—one representing the amplitude and one representing the phase of the input signal. The complex RF input signal may be provided to the amplitude predistortion module 118 for amplitude linearization and phase predistortion module 120 for phase linearization. It will be appreciated that while the two orthogonal input signals are associated with amplitude and phase, respectively, other embodiments of the invention may utilize I- and Q-components for a Cartesian system. Furthermore, other orthogonal input signals may be utilized as well without departing from embodiments of the invention.

The amplitude predistortion module 118 and the phase predistortion module 120 will now be discussed with respect to FIG. 1B, which provides a more detailed functional block diagram of the EER transmitter system 100 of FIG. 1A. As illustrated, the amplitude predistortion module 118 may be a variable gain amplifier (VGA) and the phase predistortion module 120 may be a phase adder such as voltage-controlled variable phase (VVP) shifter. The power amplifier module 112 may include a power amplifier 124 having transfer function $G\{\cdot\}$. Also, the power amplifier module 112 may additionally include one or more input matching (IM) circuits 122 and output matching (OM) circuits 126. The IM circuit 122 may provide for impedance matching at the input of the power amplifier 124 while the OM circuit 126 may provide for impedance matching at the output of the power amplifier 124.

Figure 1B:
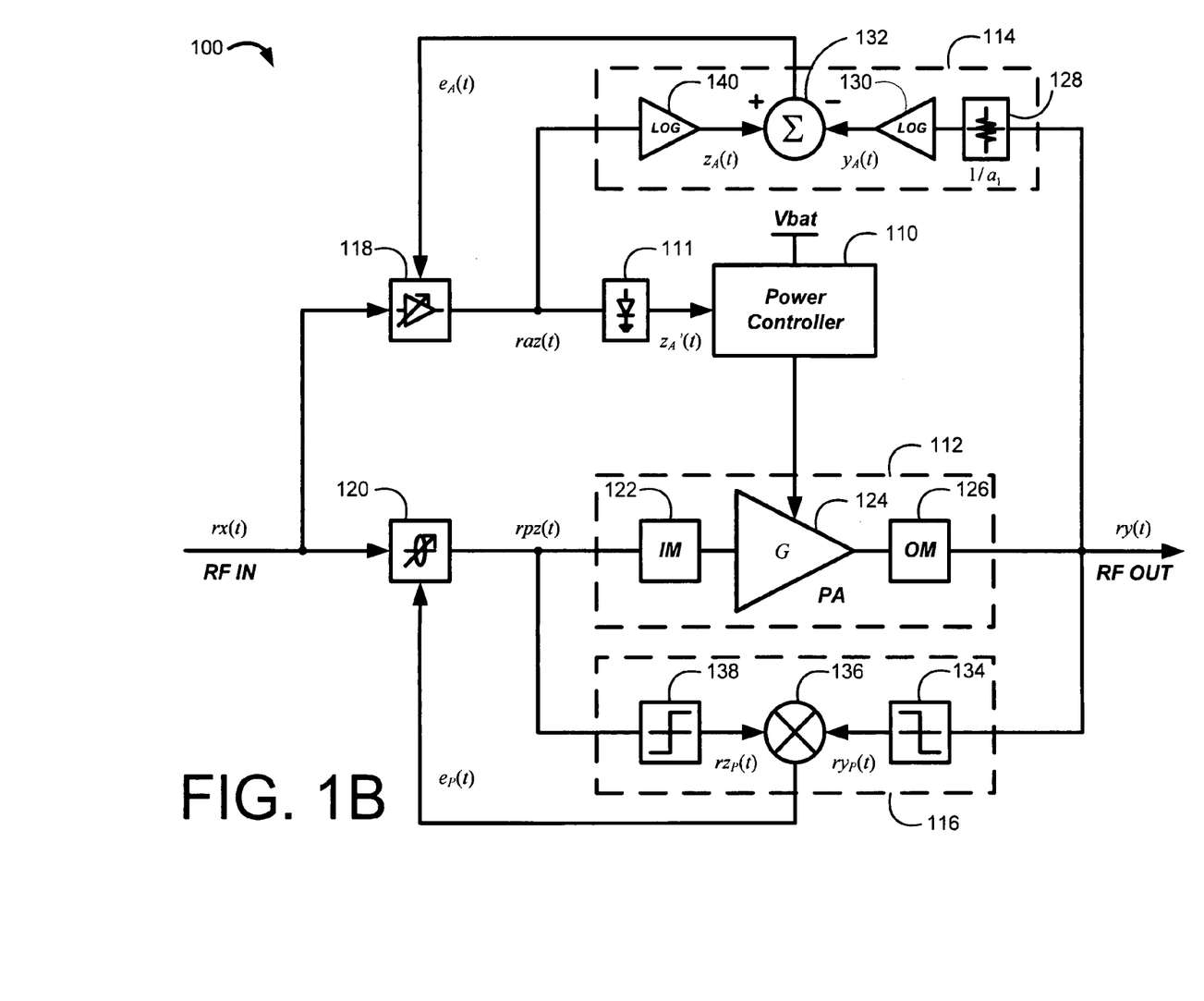

Still referring to FIG. 1B, the amplitude modulation error detection module 114 may include a subtraction device 132 like a differential error amplifier, an attenuator 128 with an attenuation of $1/a_1$, and logarithmic amplifiers 140, 130 to produce the log-detected value $z_A(t)$ of the amplitude predistorter 118 output raz(t) and the log-detected output $y_A(t)$ of the PA module 112, respectively. The phase modulation error detection module 116 may include a multiplier 136 and amplitude limiters 134, 138 to produce the amplitude-limited output $rz_P(t)$ of the phase predistortion module 120 and the amplitude-limited output $ry_P(t)$ of the PA module 112, respectively.

As will be also described in further detail below, the amplitude predistortion module 118 and the phase predistortion module 120 may be operative to predistort the amplitude signal and the phase signal of the input RF signal rx(t), respectively. In particular, the amplitude orthogonal portion $x_A(t)$ of the RF signal rx(t) may be predistorted by an inverse amplitude error signal $e_A(t)$ from the amplitude modulation error detection module 114, to produce an amplitude-predistorted RF signal raz(t). To produce the inverse amplitude error signal $e_A(t)$, the amplitude modulation error detection module 114 generally performs a comparison of the log-detected output $z_A(t)$ of the predistortion module 118 output raz(t) with the log-detected output $y_A(t)$ of the PA module 112 output ry(t). According to an embodiment of the invention, the inverse amplitude error signal $e_A(t)$ may be determined by subtracting the log-detected output $y_A(t)$ from the log-detected output $z_A(t)$. This process may recursively be performed to achieve the optimum predistortion linearization.

Likewise, the phase orthogonal portion $x_P(t)$ of the RF signal rx(t) may be predistorted by an inverse phase error signal $e_P(t)$ from the phase modulation error detection module 116, producing a phase-predistorted RF signal rpz(t). To produce the inverse phase error signal $e_P(t)$, the phase modulation error detection module 116 generally performs a comparison of the amplitude-limited output $rz_P(t)$ of the predistortion module 120 output rpz(t) with the amplitude-limited output $ry_P(t)$ of the power amplifier module 112 output ry(t). According to an embodiment of the invention, the inverse phase error signal $e_P(t)$ may be determined by multiplying the amplitude-limited output $rz_P(t)$ with the amplitude-limited output $ry_P(t)$.

In FIG. 1B, the EER transmitter system 100 may provide a linearization scheme to look at any changes of the PA output ry(t) and almost instantaneously predistort the input signal rx(t). More specifically, the predistortion mechanism in accordance with an embodiment of the invention may utilize the predistorted signal toward the PA 124 as the reference for recursive predistortion so that the outputs $e_A(t)$ and $e_P(t)$ of modulation error detection modules 114, 116 may be simply the reciprocals of the PA 124 transfer function $G\{\cdot\}$. Accordingly, the calculation of the predistortion function may be performed by analog components.

Assuming that the two paths are fully synchronized, the complex baseband input signal z(t) toward the PA 124 may be defined as follows:

$$z(t) = z_A(t) \angle z_P(t) \quad (1)$$
$$= \{x_A(t) \cdot e_A(t)\} \angle \{x_P(t) + e_P(t)\}$$
$$= x(t) \cdot e(t)$$

where $x_A(t)$ and $x_P(t)$ are the orthogonal baseband amplitude and phase input signals, respectively. Likewise, $e_A(t)$ and $e_P(t)$ are the outputs of the amplitude modulation error detection module 114 and the phase modulation error detection module 116, respectively. When a complex-form analysis are employed for simplicity, the baseband output y(t) of the PA 124 may be described as follows:

$$e(t) = a_1 \cdot G^{-1}\{|z'_A(t)|\}, \quad (2)$$

$$y(t) = z(t) \cdot G\{|z'_A(t)|\} \quad (3)$$
$$= [x(t) \cdot e(t)] \cdot G\{|z'_A(t)|\},$$

where $G\{\cdot\}$ is the PA 124 transfer function, e(t) the complex modulation error signal, x(t) the complex system input signal, z(t) the complex predistorted PA input signal, y(t) the complex PA output signal, $z_A'(t)$ the diode-detected amplitude signal to drive the power controller 110. As a result obtained from equations (1) to (3) above, a linearly amplified signal $a_1 \cdot x(t)$ can simply be generated with this architecture.

Figure 2:
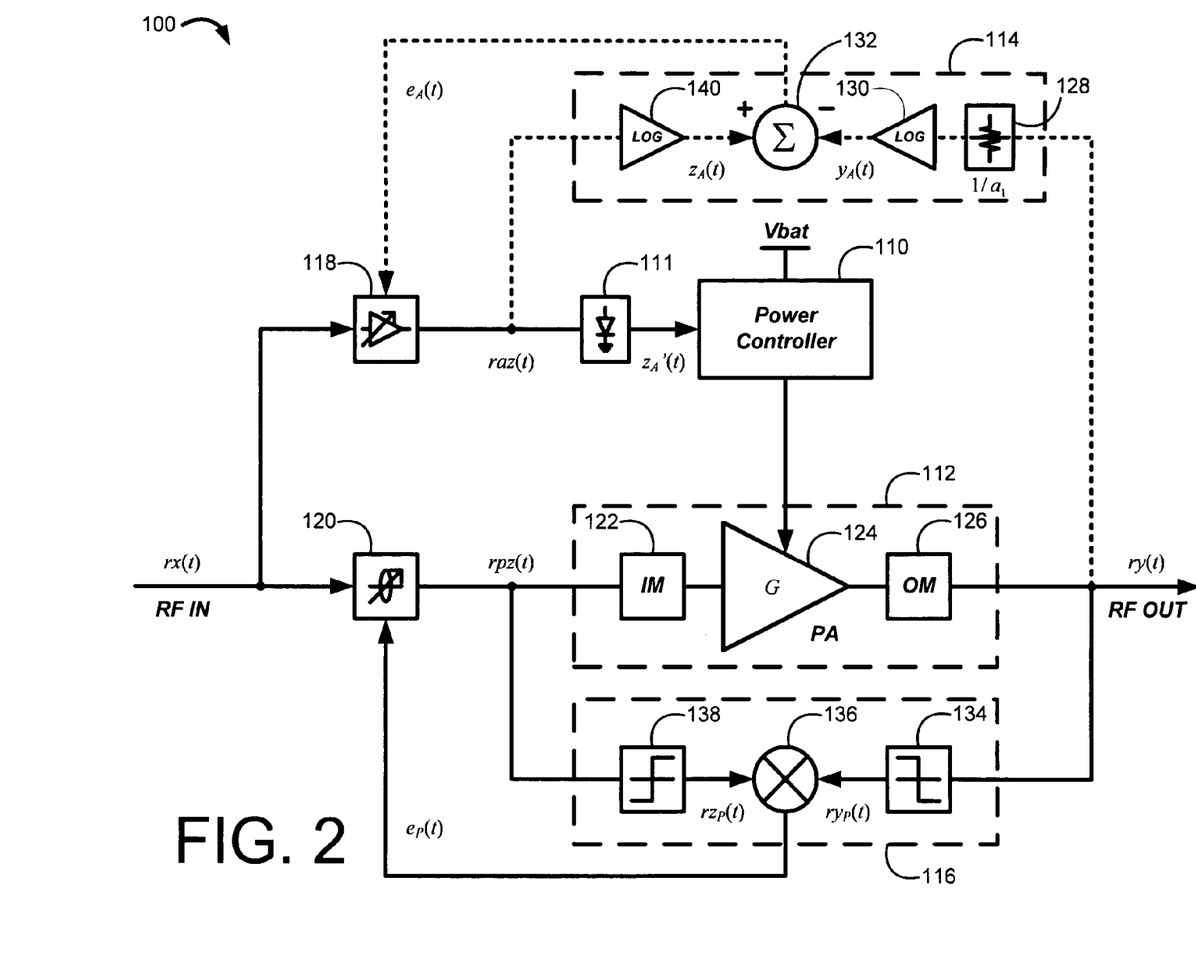
FIG. 2 illustrates an amplitude modulation error correction loop in accordance with an embodiment of the invention.

Amplitude Error Correction. The amplitude error correction loop, which includes the amplitude modulation error detection module 114, will be described in detail with reference to FIG. 2. The amplitude-predistorted signal $z_A(t)$ may be extracted from the RF signal output raz(t) of an amplitude predistortion module 118 (e.g., variable gain amplifier (VGA)) by a logarithmic amplifier 140. In addition, the amplitude signal $y_A(t)$ of the RF PA 112 output ry(t) through an attenuator 128 is extracted by a logarithmic amplifier 130. The amplitude-predistorted signal $z_A(t)$ is then compared with the amplitude signal $y_A(t)$ using a subtraction device 132 such as a differential error amplifier to obtain the amplitude error signal $e_A(t)$. The amplitude error signal $e_A(t)$ may then be logarithmically added to the orthogonal amplitude $x_A(t)$ of the RF input rx(t) through the amplitude predistortion module 118 (e.g., VGA) to produce a amplitude-predistorted RF signal rpz(t). That is, at the amplitude predistortion module 118, the amplitude error signal $e_A(t)$ may be linearly multiplied with the amplitude $x_A(t)$ of the input RF signal rx(t).

Figure 3:
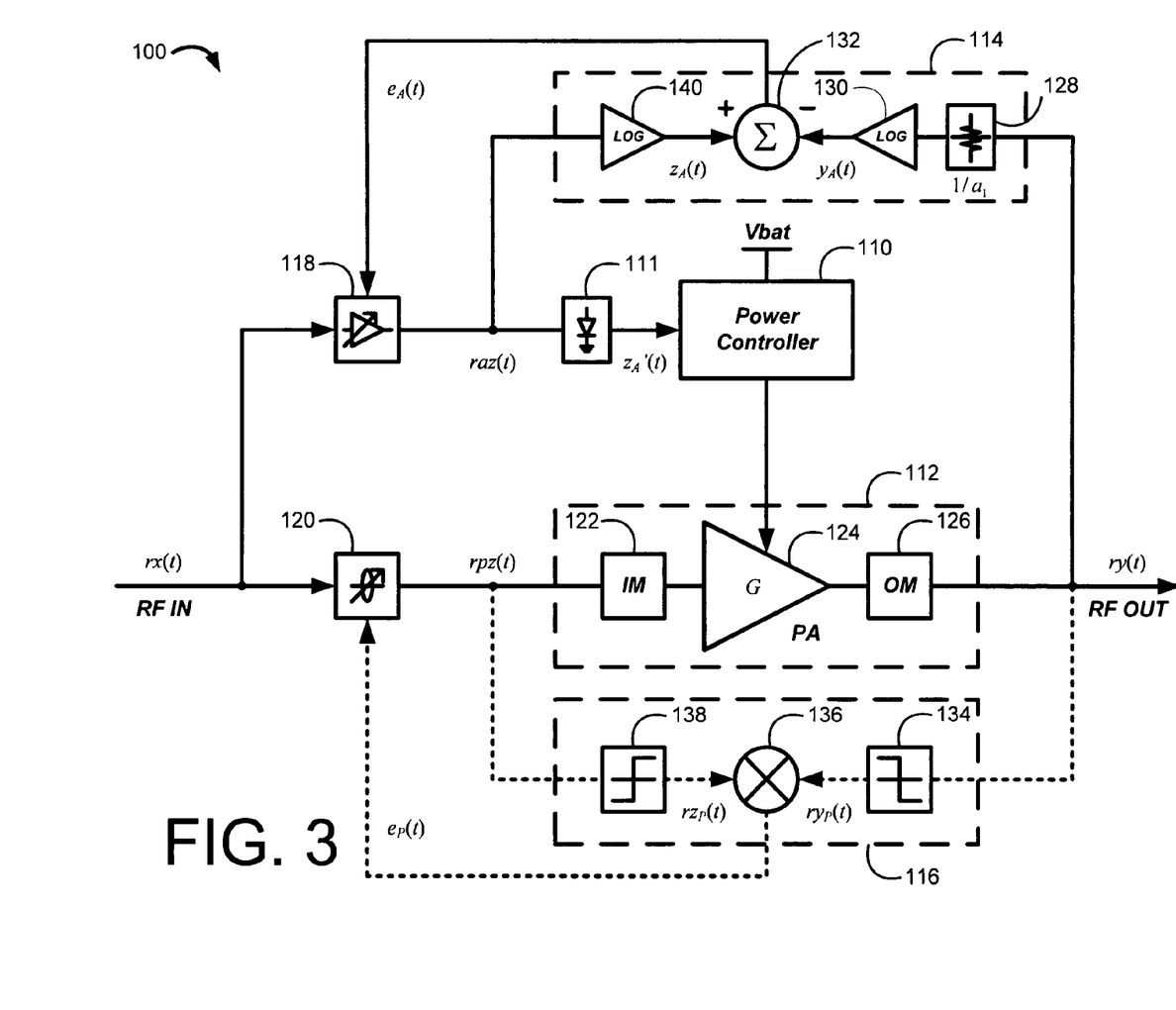
FIG. 3 illustrates a phase modulation error correction loop in accordance with an embodiment of the invention.

Phase Error Correction. FIG. 3 illustrates the phase error correction loop, which includes the phase modulation error detection module 116. As shown in FIG. 3, the phase error signal $e_P(t)$ may be obtained from the comparison of the amplitude-limited output $rz_P(t)$ of a phase predistortion module 120 (e.g., phase shifter) and the amplitude-limited output $ry_P(t)$ of the PA output ry(t) through amplitude limiters 138, 134, respectively. The phase error signal $e_P(t)$ may then added to the orthogonal phase $x_P(t)$ of the RF input rx(t) to produce the phase-predistorted RF signal rpz(t).

Figure 4:
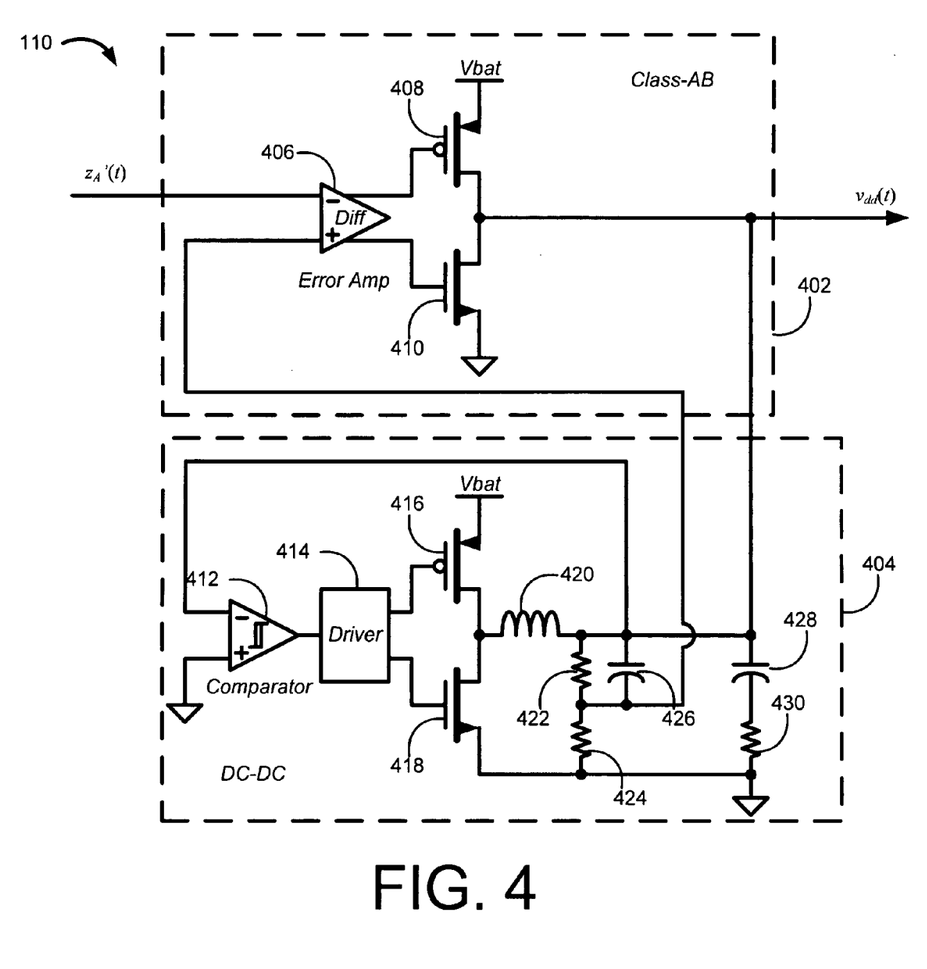
FIG. 4 illustrates an amplitude modulation scheme in accordance with an embodiment of the invention.

Amplitude Modulation. In TDMA communication systems such as GSM/EDGE, the power control of a PA output may need to meet the required time mask, while preserving the efficiency of the power supply. It may be done by using a linear regulator, switching regulator, or combined structure. Unlike the GSM system, the EDGE or WCDMA system in accordance with an embodiment of the invention requires the tracking of RF envelope signals as well as the power control. Tracking the envelope signal needs much wider operation bandwidth. FIG. 4 shows an example of a combined PA controller 110 scheme that may be employed for power efficiency and wideband operation. As shown in FIG. 4, the DC-DC converter 404 may provide the DC and low frequency load current, while the Class-AB linear amplifier 402 may provide the high frequency load current, maintaining the tracking loop closed. The DC-DC converter 404 may be controlled by the output current of the Class-AB amplifier 402. The hysteric current controller of the DC-DC converter 404 may attempt to minimize the output current of the Class-AB amplifier 402, to maximize the overall efficiency. The output capacitance 428 of the architecture may be low to maintain the high bandwidth of the Class-AB amplifier 402 loop. Moreover, the ripple current of the DC-DC converter 404 may be principally absorbed by the Class-AB linear amplifier 402 operating in conjunction with a feedback loop. Thus, this linear-assisted architecture may be expected to have a high envelope tracking bandwidth, preserving a good linearity and efficiency.

Figure 5A:
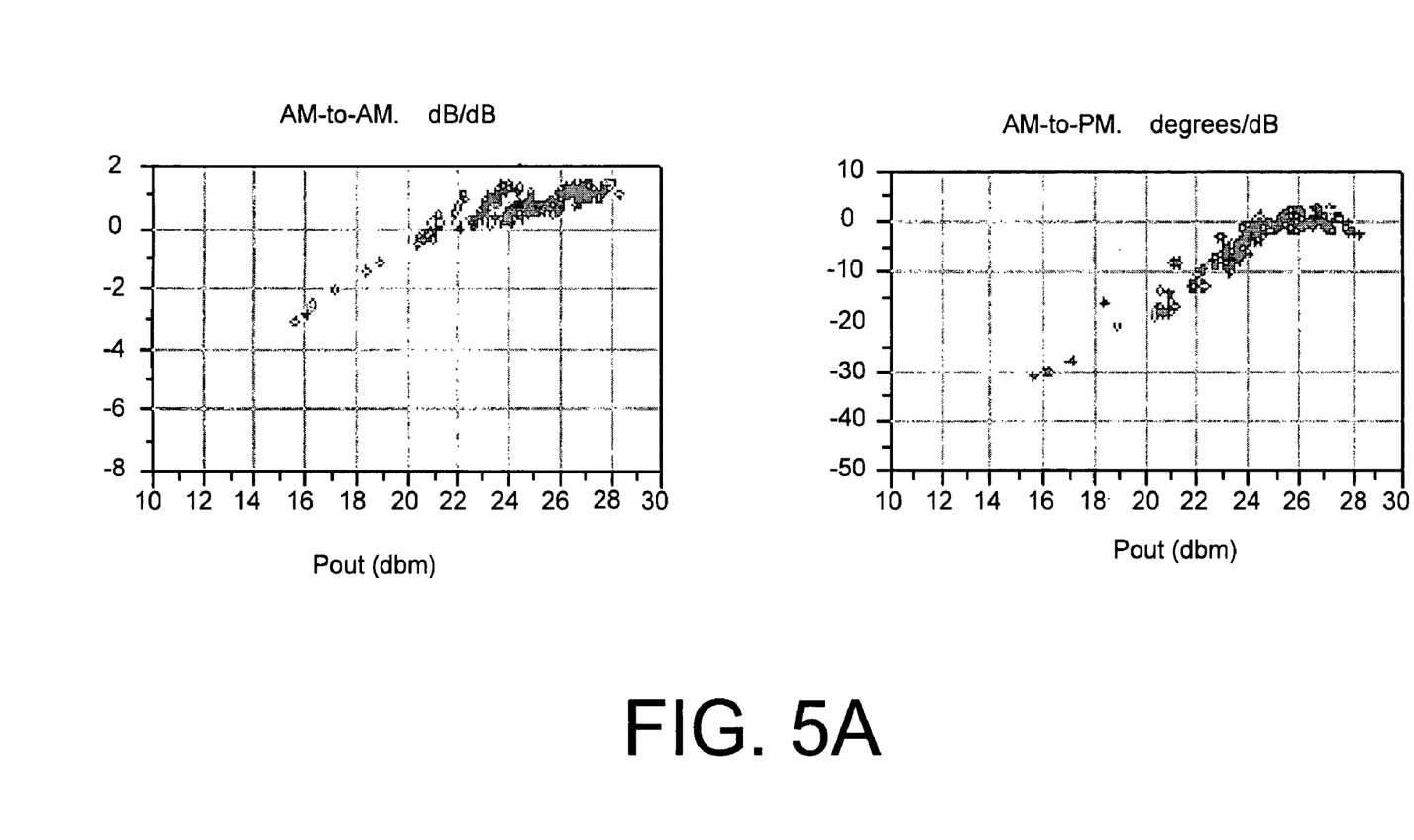
FIGS. 5A and 5B illustrates simulated power amplifier (PA) characteristics without predistortion and with predistortion, respectively, in accordance with an embodiment of the invention.
Figure 5B:
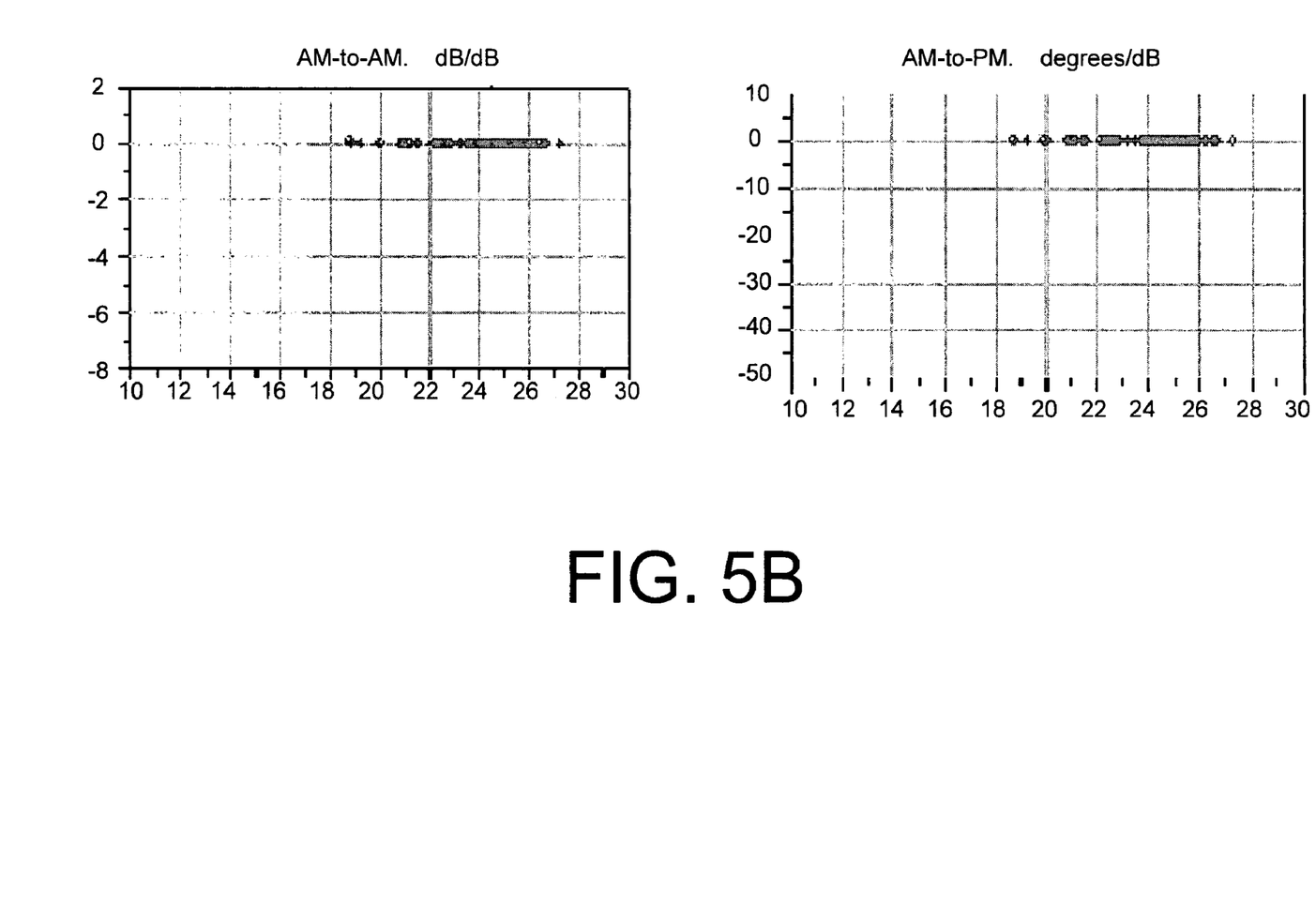

Simulation Results. The time-domain signal test shown in FIGS. 5A and 5B illustrate the improved performance of a PA 124 in accordance with an embodiment of the invention. In particular, FIG. 5A displays the results obtained without the use of the linearizer, while FIG. 5B shows the results with the use of the linearizer implemented using the predistortion provided in accordance with an embodiment of the invention. As shown in FIG. 5B, the PA 124 output with the linearizer turned on tracks the original input signal well, and the non-linearity in the amplitude and phase is well linearized, even in the situation with memory effects that display scattered PA 124 characteristics over power.

Figure 6A:
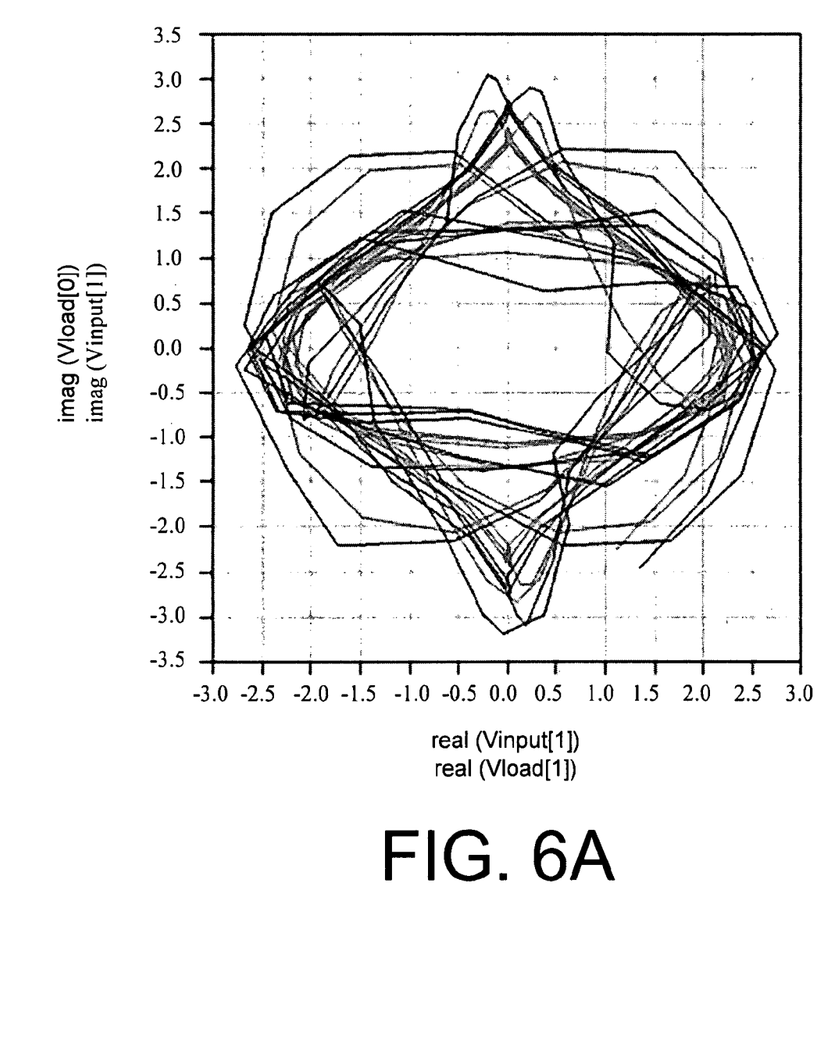
FIGS. 6A and 6B illustrate the simulated constellation results of a WCDMA signal without predistortion (EVMrms: 14.0%) and with predistortion (EVMrms: 0.07%), in accordance with an embodiment of the invention.
Figure 6B:
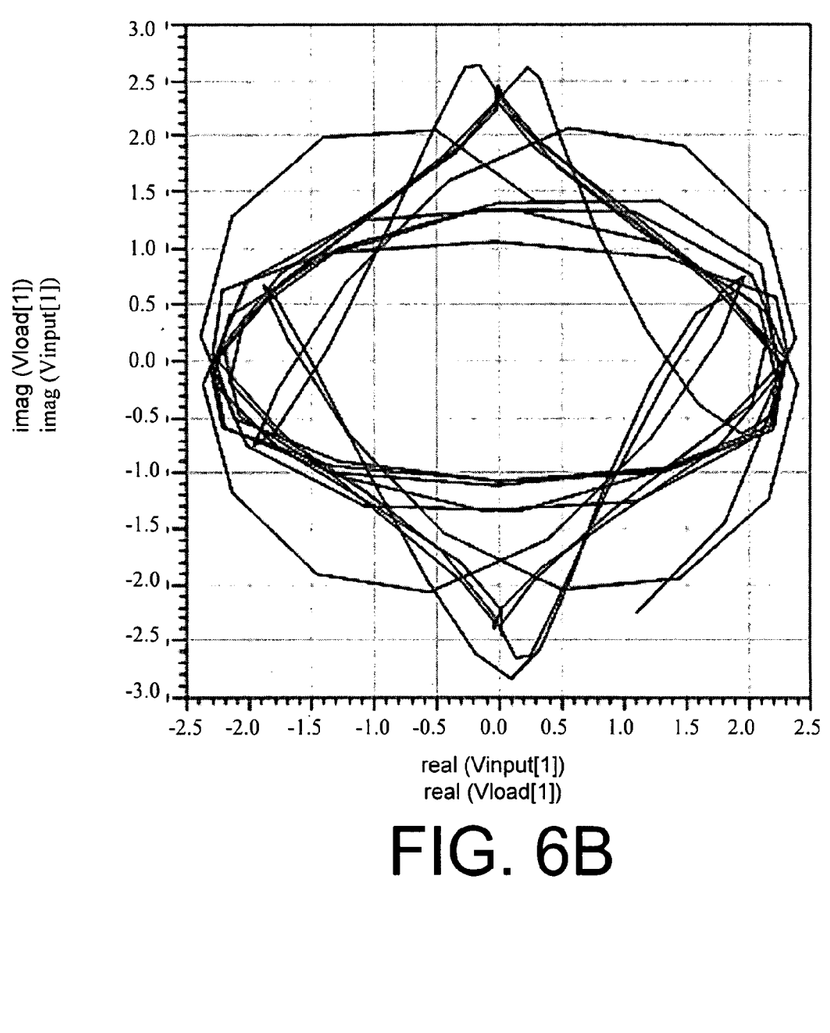
Figure 7A:
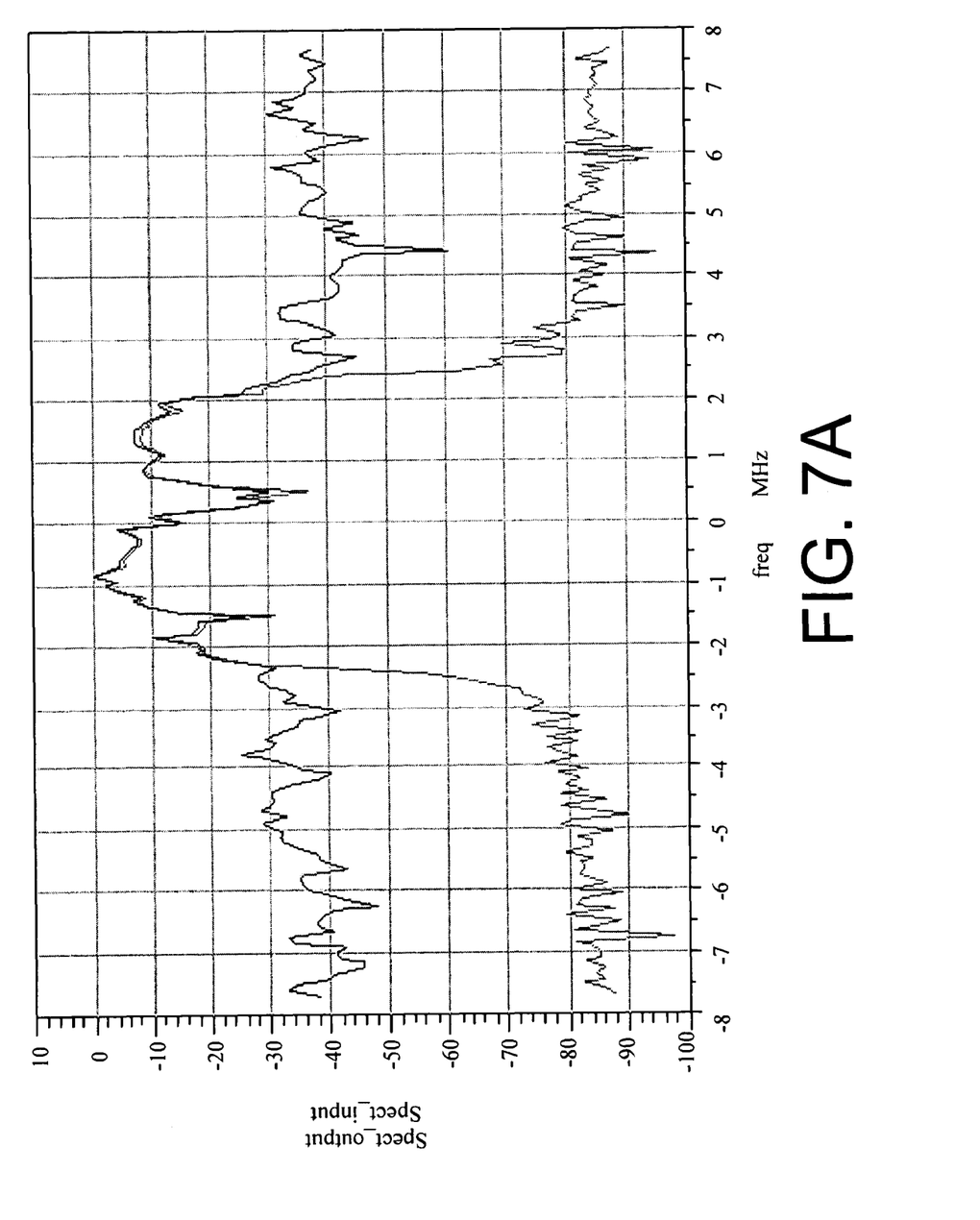
FIGS. 7A and 7B illustrate the simulated spectrum results of a WCDMA signal, in accordance with an embodiment of the invention.
Figure 7B:
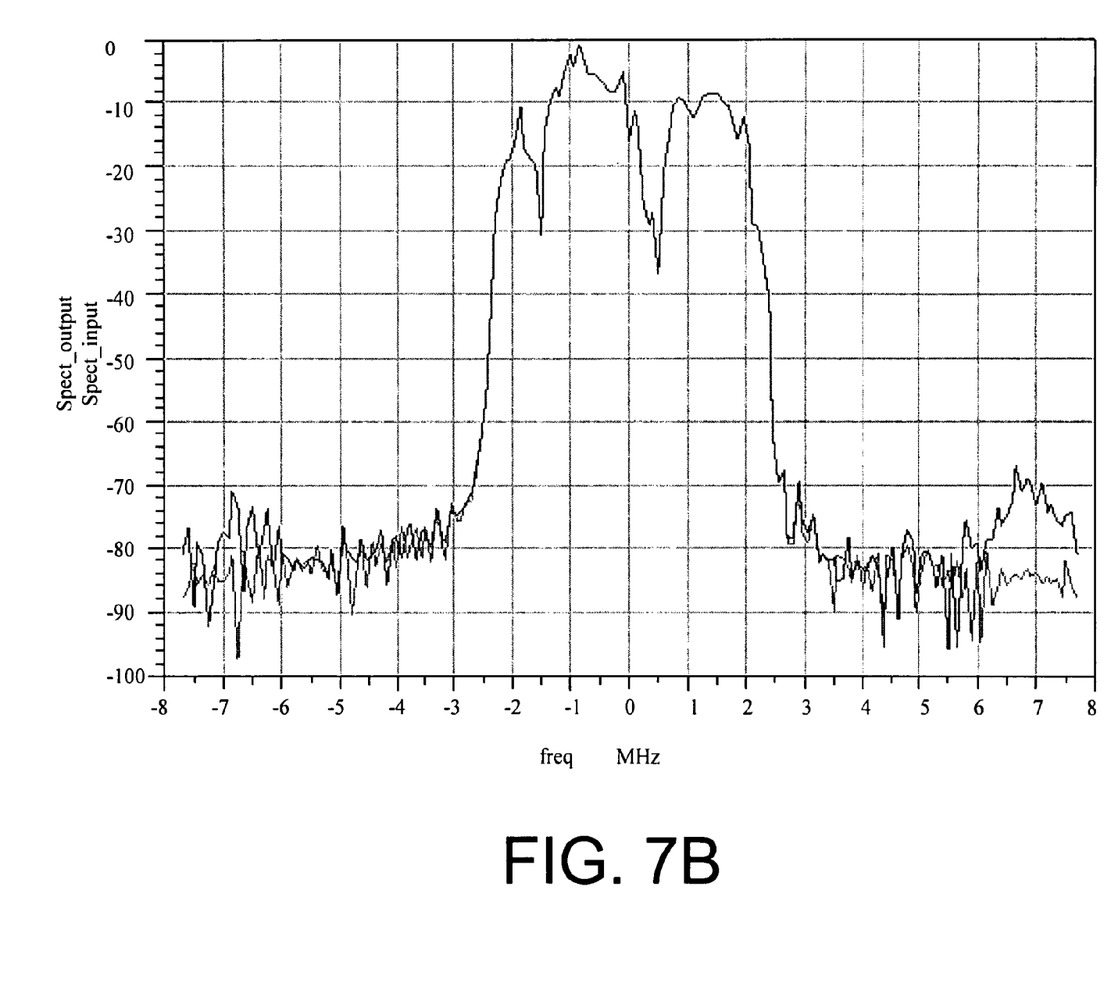

Error vector magnitude (EVM) measurement provides a means of characterizing the magnitude and phase variations introduced by the PA nonlinear behavior over a wide dynamic range. In comparison of results shown in FIGS. 6A and 6B, the EVM simulation results exhibits the improvements of 13.9% in root-mean-square (RMS) by use of the predistortion provided by embodiments of the invention. FIGS. 7A and 7B show the spectrum results. Without predistortion, a large amount of intermodulation distortions are produced, as shown in FIG. 7A. On the other hand, the simulation with predistortion displays that distortions are almost corrected and removed, as shown in FIG. 7B.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for providing a linear envelope elimination and restoration transmitter, comprising:
    generating an input amplitude signal and an input phase signal, wherein the input amplitude signal and the input phase signal are components of an input signal;
    processing the input amplitude signal using an amplitude error signal to generate a predistorted amplitude signal;
    processing the input phase signal using a phase error signal to generate a predistorted phase signal; and
    generating an output signal by a power amplifier receiving the predistorted amplitude signal and the predistorted phase signal,
    wherein the amplitude error signal is generated by combining the predistorted amplitude signal with the output signal, and
    wherein the phase error signal is generated by combining the predistorted phase signal with the output signal.

2. The method of claim 1, wherein processing the input amplitude signal includes multiplying the input amplitude signal with the amplitude error signal.

3. The method of claim 2, wherein the input amplitude signal is multiplied by the amplitude error signal using a variable gain amplifier.

4. The method of claim 1, wherein processing the input phase signal includes adding the input phase signal to the phase error signal.

5. The method of claim 4, wherein the input phase signal is added to the phase error signal using a voltage-controlled variable phase shifter.

6. The method of claim 1, wherein combining the predistorted amplitude signal with the output signal to generate the amplitude error signal comprises:
    applying a first logarithmic amplifier to the output signal of the power amplifier to obtain a log-detected output signal;
    applying a second logarithmic amplifier to the predistorted amplitude signal to obtain a log-detected predistorted amplitude signal, wherein the amplitude error signal is generated from a comparison of at least the log-detected output signal with the log-detected predistorted amplitude signal.

7. The method of claim 6, wherein the amplitude error signal is generated by subtracting the log-detected output signal from the log-detected predistorted amplitude signal.

8. The method of claim 1, wherein combining the predistorted phase signal with the output signal to generate the phase error signal comprises:
    applying a first amplitude limiter to the output signal of the power amplifier to obtain an amplitude-limited output signal;
    applying a second amplitude limiter to the predistorted phase signal to obtain an amplitude-limited predistorted phase signal, wherein the phase error signal is generated from a comparison of at least the amplitude-limited output signal with the amplitude-limited predistorted phase signal.

9. The method of claim 8, wherein the phase error signal is generated by multiplying the amplitude-limited output signal by the amplitude-limited predistorted phase signal.

10. The method of claim 1, wherein the amplitude error signal includes an approximate inverse of the gain of the power amplifier.

11. A system for a linear envelope elimination and restoration transmitter, comprising:
- a first predistortion module that processes an input amplitude signal using an amplitude error signal to generate a predistorted amplitude signal;
- a second predistortion module that processes an input phase signal using a phase error signal to generate a predistorted phase signal, wherein the input amplitude signal and the input phase signal are components of an input signal; and
- a power amplifier that receives the predistorted amplitude signal and the predistorted phase signal and generates an output signal based upon the predistorted amplitude signal and the predistorted phase signal,
- wherein the amplitude error signal is generated by combining the predistorted amplitude signal with the output signal, and
- wherein the phase error signal is generated by combining the predistorted phase signal with the output signal.

12. The system of claim 11, wherein the first predistortion module processes the input amplitude signal by multiplying the input amplitude signal with the amplitude error signal.

13. The system of claim 12, wherein the first predistortion module includes a variable gain amplifier for multiplying the input amplitude signal with the amplitude error signal.

14. The system of claim 11, wherein the second predistortion module includes a voltage-controlled variable phase shifter for adding the input phase signal with the phase error signal.

15. The system of claim 11, further comprising:
- a first logarithmic amplifier that obtains a log-detected output signal from the output signal of the power amplifier;
- a second logarithmic amplifier that obtains a log-detected predistorted amplitude signal from the predistorted amplitude signal, wherein the amplitude error signal is generated from a comparison of at least the log-detected output signal with the log-detected predistorted amplitude signal.

16. The system of claim 15, wherein the amplitude error signal is generated by subtracting the log-detected output signal from the log-detected predistorted amplitude signal.

17. The system of claim 11, further comprising:
- a first amplitude limiter that obtains an amplitude-limited output signal from the output signal of the power amplifier;
- a second amplitude limiter that obtains an amplitude-limited predistorted phase signal from the predistorted phase signal, wherein the phase error signal is generated from a comparison of at least the amplitude-limited output signal with the amplitude-limited predistorted phase signal.

18. The system of claim 17, wherein the phase error signal is generated by multiplying the amplitude-limited output signal by the amplitude-limited predistorted phase signal.

19. The system of claim 11, wherein the amplitude error signal includes an approximate inverse of the gain of the power amplifier.

20. A system for providing a linear polar transmitter, comprising:
- a first means for processing an input amplitude signal using an amplitude error signal to generate a predistorted amplitude signal;
- a second means for processing an input phase signal using a phase error signal to generate a predistorted phase signal, wherein the input amplitude signal and the input phase signal are components of an input signal; and
- a third means for generating an output signal based upon the predistorted amplitude signal and the predistorted phase signal,
- wherein the amplitude error signal is generated by combining the predistorted amplitude signal with the output signal, and
- wherein the phase error signal is generated by combining the predistorted phase signal with the output signal.

* * * * *